United States Patent [19]

Lavoie et al.

[11] Patent Number: 6,081,204
[45] Date of Patent: Jun. 27, 2000

[54] AUTOMATED COMMUNICATION OF ELECTRICITY METER DATA

[75] Inventors: Gregory P. Lavoie, Rochester; Curtis W. Crittenden, Dover; John J. Jamison, Alton; Robert E. Lee, Jr., Gonic, all of N.H.

[73] Assignee: General Electric Company, Schenectady, N.Y.

[21] Appl. No.: 08/866,787

[22] Filed: May 30, 1997

[51] Int. Cl.$^7$ ................................................. G08B 23/00
[52] U.S. Cl. ............................ 340/870.02; 340/870.03; 361/659; 705/412; 324/74
[58] Field of Search ......................... 340/870.02, 870.03; 705/412; 324/74, 142, 157; 361/659, 661, 668

[56] References Cited

U.S. PATENT DOCUMENTS

| | | | |
|---|---|---|---|
| 4,077,061 | 2/1978 | Johnston et al. | 364/483 |
| 4,803,632 | 2/1989 | Frew et al. | 340/870.02 |
| 5,214,587 | 5/1993 | Green | 340/870.02 |
| 5,495,167 | 2/1996 | Cotroneo . | |
| 5,590,179 | 12/1996 | Shincovich et al. | 340/870.03 |
| 5,644,222 | 7/1997 | Dohmstreich et al. . | |

FOREIGN PATENT DOCUMENTS

| | | |
|---|---|---|
| 195 24 551 | 1/1996 | Germany . |
| WO93/17345 | 9/1993 | WIPO . |
| WO94/07155 | 3/1994 | WIPO . |

OTHER PUBLICATIONS

PCT International Search Report, dated Sep. 7, 1998, 3 pages.

*Primary Examiner*—Michael Horabik
*Assistant Examiner*—Timothy Edwards, Jr.
*Attorney, Agent, or Firm*—Carl B. Horton, Esq.

[57] ABSTRACT

An electricity meter which, in one embodiment, includes a microcomputer coupled to both a liquid crystal display (LCD) and an optical port. The LCD includes an on board controller and an LCD random access memory (RAM), and in accordance with the present invention, the microcomputer is programmed to communicate the contents of the LCD RAM to the optical port during selected times of meter operation. Generally, and in an exemplary embodiment, when the LCD RAM data is updated by the microcomputer during meter operation, the microcomputer communicates such updated data to the optical port. In one specific implementation, a user selectable flag may be set to 1 or 0. If the user sets the flag to 0, then the communications feature is not enabled. If the flag is set to 1, then the communications feature is enabled. In operation, and upon receipt of a display quantity command, the microcomputer writes data to the LCD RAM. The microcomputer then checks whether the communications feature is selected (i.e., whether the flag is set to 0 or 1), and if the feature is not selected, processing proceeds as is known. If the flag is set to 1, then the microcomputer reads the data stored in the LCD RAM and communicates such data to the optical port.

15 Claims, 2 Drawing Sheets

AUTOMATED COMMUNICATION OF ELECTRICITY METER DATA

FIELD OF THE INVENTION

This invention relates generally to electricity metering and more particularly, to automated testing of electricity meters.

BACKGROUND OF THE INVENTION

Since data collected by a electricity meter in metering energy consumption of a load is used for billing purposes, ensuring the accuracy of such data is important. With the more recent electricity meters which include digital signal processors and microcomputers, the amount of data collected and the complexity of measurements made has increased. For example, electricity meters can display hundreds of different quantities, and many of the quantities can be displayed in different formats (e.g., different number of digits and decimal point location). Verifying that each quantity is formatted and displayed properly, with the correct annunciators, is a time consuming task.

One of the more time consuming meter features to test is the operation of the meter display. Metering data typically is not stored in the meter memory in engineering units (e.g., kilowatthours). Rather, the metering data is stored in the meter memory in values proportional to engineering units. When the meter displays a value, the quantity is retrieved from the meter memory, scaled by a proper scaler, and then the correct segments on the display (e.g., an LCD) are "lighted" to show the quantity. In addition, the appropriate corresponding data annunciators (e.g., kWh for kilowatthour quantity) also are "lighted".

In the past, and when testing the meter display, it is known to provide a meter with known inputs and then to check whether the meter displays the correct quantities. An operator typically views the display and as the display scrolls down, the operator writes down the displayed quantity on a note pad. The quantities written down by the operator are then manually compared to the expected quantities, and if the quantities correspond, then the meter is deemed to have passed the test. Of course, requiring an operator to write down displayed quantities, particularly for a meter which displays hundreds of quantities, is a time consuming task.

It would be desirable to provide more automated testing of meters to substantially eliminate the requirement that meter quantities be written down by an operator when testing the meter display. It also would be desirable to provide such automated testing without significantly increasing the fabrication cost of a meter, in terms of both labor and materials.

SUMMARY OF THE INVENTION

These and other objects may be attained by an electricity meter which, in one embodiment, includes a microcomputer coupled to both an LCD display and an optical port. The LCD display includes an on board controller and an LCD random access memory (RAM), and in accordance with the present invention, the microcomputer is programmed to communicate the contents of the LCD RAM to the optical port during selected times of meter operation. Generally, and in an exemplary embodiment, when the LCD RAM data is updated by the microcomputer during meter operation, the microcomputer communicates such updated data to the optical port. In one specific implementation, a user selectable flag may be set to 1 or 0. If the user sets the flag to 0, then the communications feature is not enabled. If the flag is set to 1, then the communications feature is enabled.

In operation, and upon receipt of a display quantity command, the microcomputer writes data to the LCD RAM. The microcomputer then checks whether the communications feature is selected (i.e., whether the flag is set to 0 or 1), and if the feature is not selected, processing proceeds as is known. If the flag is set to 1, then the microcomputer reads the data stored in the LCD RAM and communicates such data to the optical port.

By programming the meter microcomputer as described above, a test device can be coupled to the optical port during normal meter operation. The device can then passively wait to receive data communicated to the port by the microcomputer, and by comparing the bit pattern received to the expected bit pattern (i.e., the bit pattern to be stored in LCD RAM under the predetermined conditions), the test device can verify proper operation of the meter. Further, and using the above described operation, the meter does not have to operate in a special mode of operation during communication to prevent a communication in progress (e.g., bUSy) message. In addition, the test device does not need to know how often the LCD RAM is updated. For example, in some known meters, the display scroll time is programmable, and in order to correctly read the LCD RAM, the test device needs to ascertain the scroll time and then read the LCD RAM at a proper time for each display element. With the above described operation, the test device simply passively waits to receive data communicated to it via the optical port. Also, with some known meters, communications with the meter via the meter optical port is not allowed during test operations. With the above described meter, however, such communications can occur during all modes of operation, including test mode. Further, and with the above described meter, displayable meter data (i.e., revenue data and programmed data) is communicated in a formatted manner (i.e., in the format required to display the data by the LCD) rather than in a raw, unformatted manner in which the data is stored internally in meter memory.

DETAILED DESCRIPTION

Figure 1:
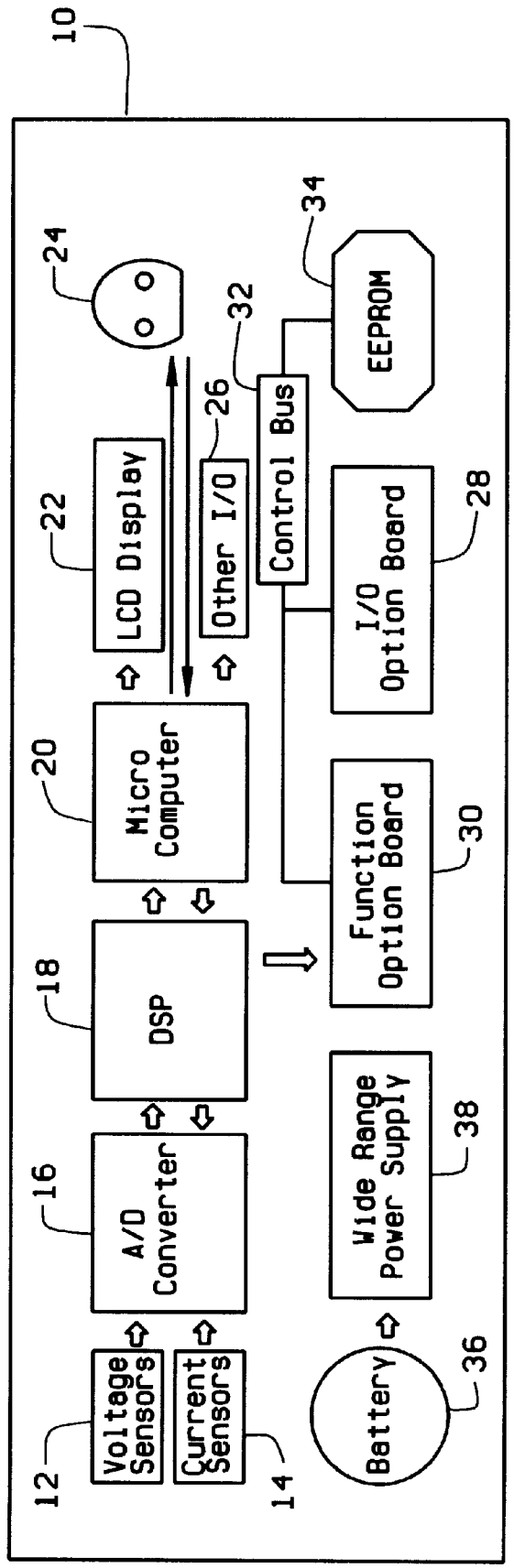
FIG. 1 is a block diagram of an electronic energy meter.

FIG. 1 is a block diagram illustration of an exemplary electronic energy meter 10 which, for example, is commercially available from General Electric Company, 130 Main Street, Somersworth, N.H. 03878, and generally referred to as the KV meter. The KV meter can be modified as described below in more detail to provide more automated testing. Although the present apparatus and methods are described herein in the context of an electronic electricity meter, it should be understood that the present invention is not limited to practice with any one particular meter. The present invention can be utilized in connection with other microcomputer based meters.

Referring now specifically to FIG. 1, meter 10 includes voltage sensors 12 and current sensors 14. Sensors 12 and 14, in operation, typically are coupled to the power lines supplying power to site at which the meter is located. Sensors 12 and 14 are coupled to an analog to digital (A/D) converter 16 which converts the input analog voltage and current signal to digital signals. The output of converter 16 is provided to a digital signal processor (DSP) 18. DSP 18 supplies microcomputer 20 with digitized metering quantities, e.g., $V^2H$, $I^2H$. Microcomputer 20, using the metering quantities supplied by DSP 18, performs additional metering calculations and functions. DSP 18 may, for example, be a processor commercially available as Model Number TMS320 from Texas Instruments Company, P.O. Box 6102, Mail Station 3244, Temple, Tex. 76503, modified to perform metering functions.

Microcomputer 20 is coupled to a liquid crystal display 22 to control the display of various selected metering quantities and to an optical communications port 24 to enable an external reader or tester to communicate with computer 20. Port 24 may be the well known OPTOCOM™ port of General Electric Company, 130 Main Street, Somersworth, N.H. 03878, which is in accordance with the ANSI type II optical port. Microcomputer 20 may also generate additional outputs 26 used for various other functions as is well known in the art. Microcomputer 20 may, for example, be an eight bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 20 also is coupled to an input/output (I/O) board 28 and to a function, or high function, board 30. DSP 18 also supplies outputs directly to high function board 30. Microcomputer 20 further is coupled, via a control bus 32, to an electronically erasable programmable read only memory (EEPROM) 34. I/O board 28 and high function board 30 also are coupled, via bus 32, to EEPROM 34.

Back-up power is supplied to the meter components described above by a battery 36 coupled to a wide range power supply 38. In normal operation when no back-up power is required, power is supplied to the meter components from the power lines via power supply 38.

Many functions and modifications of the components described above are well understood in the metering art. The present application is not directed to such understood and known functions and modifications. Rather, the present application is directed to the methods and apparatus for testing the meter display as described below in more detail. In addition, although the methods and apparatus are described below in the hardware environment shown in connection with FIG. 1, it should be understood that such methods and apparatus are not limited to practice in such environment. The subject methods and apparatus could be practiced in many other environments.

Further, it should be understood that the present invention can be practiced with many alternative microcomputers, and is not limited to practice in connection with just microcomputer 20. Therefore, and as used herein, the term microcomputer is not limited to mean just those integrated circuits referred to in the art as microcomputers, but broadly refers to microcomputers, processors, microcontrollers, application specific integrated circuits, and other programmable circuits.

With respect to LCD display 22 which in the exemplary embodiment includes an on board LCD controller (e.g., a Hitachi H8/3834 series controller) with a random access memory (RAM), such controller lights segments of display 22 based on the data written to a specific segment of RAM. For example, if a particular RAM location is set to 1, then the corresponding segment is lit. Otherwise, the segment is not lit. The RAM can be read from and written to as is known in the art. During a communications session, LCD display 22 typically will display an indication that such a session is occurring, e.g., display 22 may display a bUSy message. Therefore, by reading the LCD RAM during a communication session, the pattern read will be that required to display the communication message.

In accordance with the present invention, and to provide more automated testing of meter operations, microcomputer 20 is programmed to communicate the contents of the LCD RAM to optical port 24 during selected times of meter operation. Generally, and in an exemplary embodiment, when the LCD RAM data is updated by microcomputer 20 during meter operation, microcomputer 20 communicates such updated data to optical port 24. More specifically, microcomputer 20 is programmed to communicate data to communication port 24 at least upon the occurrence of a set of predetermined conditions. In the one embodiment, the conditions are that a display quantity command be received by microcomputer 20, that data be written to display 22 by microcomputer 20, and that a flag in the memory of microcomputer have a first status, e.g., a value of 1. In the exemplary embodiment, such data is communicated to port 24 by microcomputer 20 asynchronously at 9600 baud.

Figure 2:
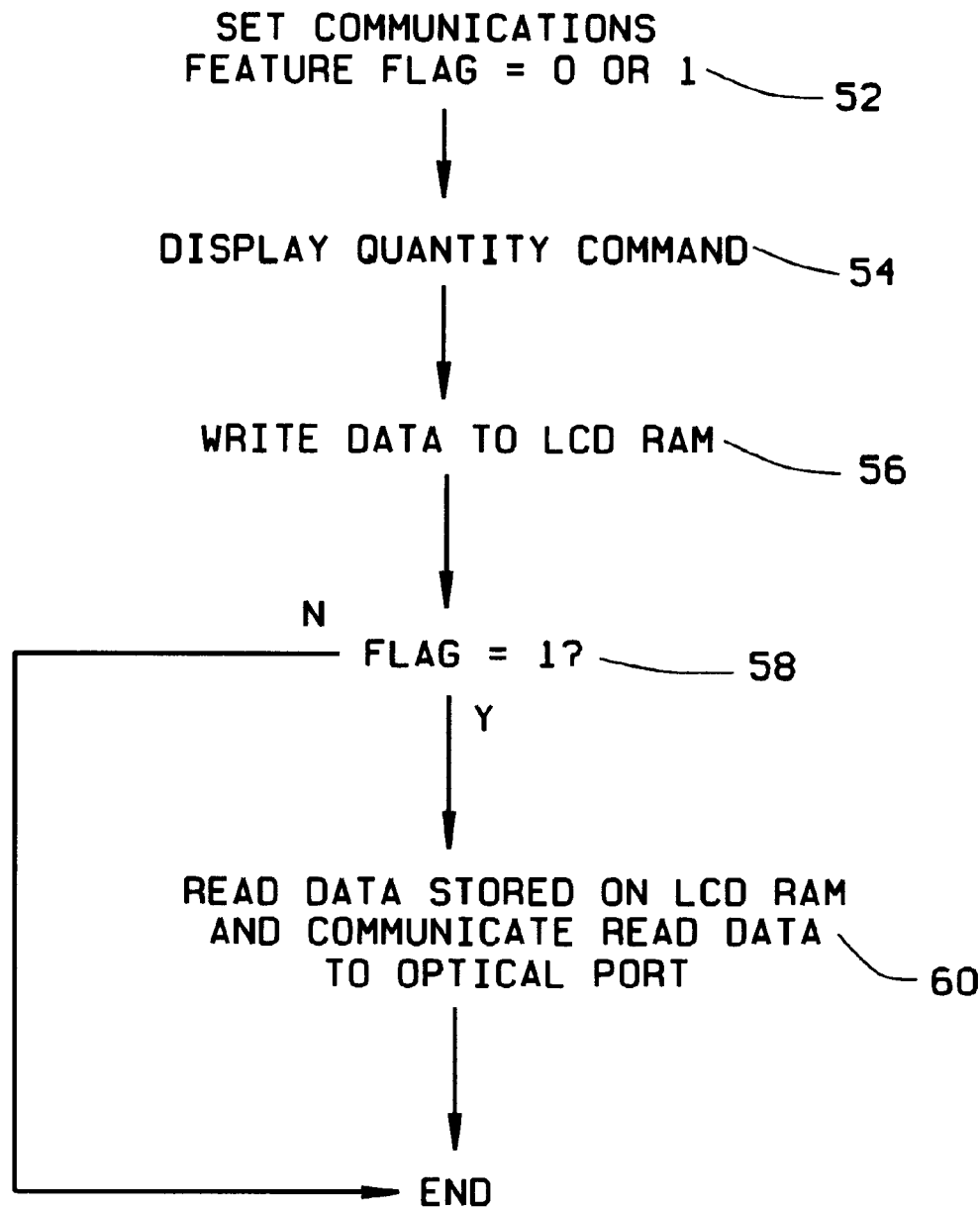
FIG. 2 is a flow chart illustrating operation of the microcomputer shown in FIG. 1 in accordance with one embodiment of the present invention.

In one specific implementation, and referring to FIG. 2 which is a flow chart 50 illustrating operation of microcomputer 20 in accordance with one embodiment of the present invention, a user selectable communications feature flag may be set 52 to 1 or 0. The flag value is stored in a predesignated location in the microcomputer memory. If the user sets the flag to 0, then the communications feature is not enabled. If the flag is set to 1, then the communications feature is enabled. The flag typically is set by an operator and once set, need not be re-set unless the operator desires to enable or disenable the feature, after re-programming, or after a power outage.

In operation, and upon receipt of a display quantity command 54, microcomputer 20 writes data to the LCD RAM 56. Microcomputer 20 then checks 58 whether the communications feature is selected (i.e., whether the flag is set to 0 or 1), and if the flag is set to 1, then microcomputer 20 reads the data stored in the LCD RAM and communicates 60 such data to optical port 24. The routine is then exited 62. If the feature is not selected (i.e., flag=0), the routine is exited 62 and processing proceeds as is known. In one specific implementation, the communications feature can be easily disabled by clearing the flag, and the feature is always disabled after the meter is reprogrammed or when the power is cycled.

The above described processing only enables communications of the LCD RAM data to optical port 24 when a quantity is updated in the LCD RAM. It is contemplated that the LCD RAM data also could be communicated to optical port 24 under other conditions, such as upon the occurrence of selected real time events such as the end of a demand interval, if desired.

By programming microcomputer 20 as described above, a test device can be coupled to optical port 24 during test operation. The device can then passively wait to receive data communicated to port 24 by microcomputer 20, and by comparing the bit pattern received to the expected bit pattern (i.e., the bit pattern to be stored in LCD RAM under the predetermined conditions), the test device can verify proper operation of the meter.

Using the above described operation, the meter does not have to operate in a special mode of operation during communication to prevent a communication in progress (e.g., bUSy) message. In addition, the test device does not need to know how often the LCD RAM is updated. For example, in some known meters, the display scroll time is programmable, and in order to correctly read the metering data, the test device needs to ascertain the scroll time and then read the data at a proper time for each display element. With the above described operation, the test device simply passively waits to receive data communicated to it via optical port 24. Also, with some known meters, communications with the meter via the meter optical port is not allowed during test operations. With the above described meter, however, such communications can occur during all modes of operation, including test mode. Further, and with the above described meter, displayable meter data (i.e., revenue data and programmed data) is communicated in a formatted manner (i.e., in the format required to display the data by display 22) rather than in a raw, unformatted manner in which the data is stored internally in meter memory.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

We claim:

1. An electricity meter for measuring energy consumption of a load, comprising:

voltage and current sensors for generating signals representative of current and voltage at the load;

a microcomputer coupled to said sensors, said microcomputer comprising a random access memory;

a display coupled to said microcomputer for displaying metering values; and a communication port coupled to said microcomputer;

said microcomputer configured to test operation of the display by:
   writing data to the random access memory of the display,
   reading the data from the display random access memory, and
   communicating at least the read data to the communication port.

2. A meter in accordance with claim 1 wherein said communication port is an optical communication port.

3. An electricity meter in accordance with claim 1 wherein said microcomputer is further programmed to not communicate data to said port while in said test mode if said flag has a second status.

4. An electricity meter in accordance with claim 1 wherein said display comprises a random access memory, and wherein reading data written to said display comprises reading said random access memory.

5. A method of operating a microcomputer of a meter including voltage and current sensors for generating signals representative of current and voltage at the load, the microcomputer coupled to the sensors and including a memory having at least one memory location designated for storage of at least one flag, the meter further including a display coupled to the microcomputer for displaying metering values and a communication port coupled to the microcomputer, said method comprising the steps of:

upon receipt of a display quantity command, writing data to the display;

checking the flag status, and if the flag has a first status, reading the data written to the display and communicating at least the read data to the port.

6. A method in accordance with claim 5 wherein if the flag has a second status, then not proceeding with communicating data to the port based on the display quantity command.

7. A method in accordance with claim 5 wherein the communication port is an optical communication port.

8. An electricity meter for measuring energy consumption of a load, comprising:

a microcomputer;

a display coupled to said microcomputer for displaying metering values; and a communication port coupled to said microcomputer;

said microcomputer programmed to communicate data to said communication port at least upon the occurrence of a set of predetermined conditions to test operation of said display, at least one of said conditions being that data is written to said display, and wherein to communicate data to said communication port, said microcomputer reads data from said display and communicates said data to said port.

9. A meter in accordance with claim 8 wherein said set of predetermined conditions further comprises the condition that a display quantity command be received by said microcomputer.

10. A meter in accordance with claim 8 wherein said microcomputer further comprises a memory having at least one memory location designated for storage of at least one flag.

11. A meter in accordance with claim 10 wherein said set of predetermined conditions further comprises the condition that the one flag have a first status.

12. A meter in accordance with claim 8 wherein said communication port is an optical communication port.

13. A microcomputer for an electricity meter including a communication port and a display, the display including a random access memory, said microcomputer configured to test operation of the display by:

writing data to the random access memory of the display, reading the data from the display random access memory, and communicating at least the read data to the communication port.

14. A microcomputer in accordance with claim 13 wherein said microcomputer comprises a memory having a predetermined memory location, and to test operation of the display, a display quantity command is transmitted to said microcomputer and said predetermined memory location has a first status.

15. A microcomputer in accordance with claim 14 wherein if said predetermined memory location has a second status, said microcomputer does not test operation of the display.

* * * * *